(12) United States Patent
Chen

(10) Patent No.: US 6,392,231 B1
(45) Date of Patent: May 21, 2002

(54) SWINGING OBJECTIVE RETARDING IMMERSION LENS ELECTRON OPTICS FOCUSING, DEFLECTION AND SIGNAL COLLECTION SYSTEM AND METHOD

(75) Inventor: Zhong-Wei Chen, San Jose, CA (US)

(73) Assignee: Hermes-Microvision, Inc., San Jose, CA (US)

( * ) Notice: Subject to any disclaimer, the term of this patent is extended or adjusted under 35 U.S.C. 154(b) by 0 days.

(21) Appl. No.: 09/513,306

(22) Filed: Feb. 25, 2000

(51) Int. Cl.[7] ..................... H01J 37/141; H01J 37/147; H01J 37/28
(52) U.S. Cl. ................................. 250/310; 250/396 ML
(58) Field of Search ..................... 250/310, 396 ML

(56) References Cited

U.S. PATENT DOCUMENTS

| | | | |
|---|---|---|---|
| 4,219,732 A | 8/1980 | Nakagawa et al. | 250/396 |
| 4,785,176 A | 11/1988 | Frosien et al. | 250/396 |
| 4,823,005 A | 4/1989 | Garth | 250/310 |
| 4,896,036 A | 1/1990 | Rose et al. | 250/310 |
| 5,241,176 A | 8/1993 | Yonezawa | 250/310 |
| 5,424,541 A | 6/1995 | Todokoro et al. | 250/310 |
| 5,563,415 A | 10/1996 | Crewe | 250/396 |
| 5,614,833 A | 3/1997 | Golladay | 324/751 |
| 5,780,859 A | 7/1998 | Feuerbaum et al. | 250/396 |
| 6,037,589 A * | 3/2000 | Yonezawa et al. | 250/310 |
| 6,218,664 B1 * | 4/2001 | Krans et al. | 250/310 |

* cited by examiner

Primary Examiner—Jack Berman
(74) Attorney, Agent, or Firm—Chein-Wei(Chris)Chou; Anthony B. Diepenbrock III; Oppenheimer Wolff & Donnelly LLP

(57) ABSTRACT

A swinging objective retarding immersion lens system and method therefore which provide a low voltage electron beam with high beam current, relatively high spatial resolution, a relative large scan field, and high signal collection efficiency. The objective lens includes a magnetic lens for generating a magnetic field in the vicinity of the specimen to focus the particles of the particle beam on the specimen, an electrode having a potential for providing a retarding field to the particle beam near the specimen to reduce the energy of the particle beam when the beam collides with the specimen; a deflection system including a plurality of deflection units situated along the beam axis for deflecting the particle beam to allow scanning on the specimen with large area, at least one of the deflection units located in the retarding field of the beam, the remainder of the deflection units located within the central bore of the magnetic lens; and a annular detection unit with a relatively small aperture, located underneath the primary beam define aperture, to capture secondary electron (SE) and backscattered electrons (BSE).

47 Claims, 7 Drawing Sheets

SWINGING OBJECTIVE RETARDING IMMERSION LENS ELECTRON OPTICS FOCUSING, DEFLECTION AND SIGNAL COLLECTION SYSTEM AND METHOD

FIELD OF THE INVENTION

This invention relates generally to scanning electron microscopes, and in particular, to a swinging objective retarding immersion lens electron optics focusing and deflection system and method that can provides a high current low voltage primary electron beam, high resolution scanning, large scan field, and high signal capture efficiency.

BACKGROUND OF THE INVENTION

Scanning electron microscopes are used in many applications that require inspection of very small structures of an object in great detail. Some of these applications include defect review and inspection of specimens such as very large scale integrated (VLSI) circuits, or wafers, or other articles, critical dimensioning of features in these specimens and also design and process verification of the specimens. Scanning electron microscopes are considered superior to optical microscopes for viewing features in sub-micron dimensions, currently about 0.2 $\mu$m (1 $\mu$m=$10^{-6}$ meters) or less, due to the short wavelength that helps the scanning electron microscope to generate a small spot size. Scanning electrons microscopes typically employ an objective lens system for focusing the electron beam onto the specimen under examination.

A scanning electron microscope typically includes a primary electron beam source, an accelerating anode, an objective lens for focusing the beam onto the specimen, a plurality of deflection units that enable the positioning and scanning movement of the primary beam over the specimen, and a detection system for capturing secondary electrons (SE) or backscattered electrons (BSE) from the specimen to produce an image of the specimen. In some cases a condenser lens system is used to provide a focused beam for the objective lens system. As known to those skilled in the pertinent art, the electron beam source generates a supply of electrons for the primary beam. The condenser lens system, if used, forms an image of the primary electron beam source for the objective lens and the objective lens focuses the condenser lens image onto the specimen. The deflection system moves the focused beam over a portion of the specimen in a scanning motion and secondary and backscattered electrons are released from the specimen material. These electrons are detected, amplified and the resulting signal used to modulate the beam of an imaging system operating synchronously with the scanning electron beam. The result is an image of the scanned area based on the electrons emitted or scattered from the specimen.

Prior art scanning electron microscopes have several drawbacks. First, in order to obtain high resolution for the prior art objective lens, a relatively high beam energy, say 15KeV or more, primary electron beam source is required. However, applying such a higher energy electron beam directly to the specimen is undesirable because it can cause damage to the specimen, which consequently leads to a reliability problem in the engineering, manufacturing and production of integrated circuits. Using a low energy primary electron beam source avoids the reliability problem but limits the spatial resolution due to chromatic aberration of the objective lens and by electron-electron interaction within the beam. Chromatic aberration of the objective lens arises from electrons of different velocity experiencing different focal points for the same lens. This effect creates a disk of confusion at the image plane on the specimen and limits resolution of the system. Both electron-electron interaction (space-charge effect) and chromatic aberration are reduced by using a higher energy electron beam. Second, it is difficult to achieve high secondary and backscattered electron capture efficiency with a low energy primary electron beam source. If a multi-channel plate is used, there is a severe reliability problem due to contaminants collecting in the holes (channels) of the plate.

As stated above, spatial resolution of current low voltage scanning electron microscopes is essentially limited by the chromatic aberration of the objective lens and by the electron-electron interaction, or Boersch effect. One way to improve the spatial resolution is to reduce the electron-electron interaction by using a high-energy primary bean which is subjected to a retarding field. Another way to improve spatial resolution is to use a snorkel (center pole) magnetic lens to reduce the loss in resolution due to chromatic and spherical aberration.

Conventional retarding field scanning electron microscopes which are equipped with a snorkel magnetic lens, a retarding electrostatic plate and pre-lens double deflection units are currently used for critical dimension measurement, defect review and defect inspection system in VLSI (very large scale integrated) wafer manufacturing. These conventional units still have several drawbacks.

First, it is difficult to generate a large deflection field with these units, where the deflection field is the reachable area in the plane of the specimen over which the primary beam can be moved by the deflection system. As a consequence, only a relatively small portion of the specimen can be examined at a time without repositioning the specimen. Second, because of the inherently small deflection field, the time required for inspecting, reviewing and measuring a specimen is substantially long. This results in increased engineering, testing, troubleshooting, and production costs, as well as an increase in integrated circuit turnaround time.

Thus, there is a need for an objective lens for an electron scanning microscope and method therefore that provides high primary beam current, lower energy electron beam on the specimen, relatively high resolution, a relative large scanning field, and a high signal capture efficiency.

SUMMARY OF THE INVENTION

A scanning electron microscope having a swinging objective retarding immersion lens electron optics focusing, deflection and signal capture system is disclosed herein that overcomes the drawbacks discussed above with regard to prior art objective lens. Specifically, the objective lens system of the invention converts a high energy primary electron beam to a lower energy electron beam at the specimen to minimize damage to the specimen. It also has relatively high resolution for clear examination of submicron features. Moreover, a scanning electron microscope, in accordance with the present invention, provides a relatively large deflection field to reduce the time to fully examine the specimen and includes a detection unit to more efficiently capture secondary electrons (SE) and backscattered electrons from the specimen (BSE).

One aspect of the invention includes a Swinging Objective Retarding Immersion Lens (SORIL) system for examination of a specimen including a a magnetic lens for generating a magnetic field in the vicinity of the specimen to focus the particles of the particle beam on the specimen, the magnetic lens having a central bore through which the particle beam travels; an electrode for providing a retarding field to the particle beam near the specimen to reduce the energy of the particle beam when the beam collides with the specimen; and a deflection system including a plurality of deflection units situated along the beam axis for deflecting the particle beam to allow scanning of the specimen, at least one of the deflection units located in the retarding field of the beam, the remainder of the deflection units located within the central bore of the magnetic lens; and an annular detection unit with a small aperture to capture SE and BSE.

Another aspect of the invention includes a method for increasing a scan field of an objective lens system over a specimen having the steps of: generating a magnetic field in the vicinity of the specimen to focus the particles of the particle beam on the specimen; providing a retarding electric field to reduce the energy of the particle beam prior to the beam colliding with the specimen; positioning the focused particle beam over area to be scanned, the area being within the deflection field of the specimen, a final stage of positioning occurring by deflecting the beam within the retarding electric field to increase the deflection field over the specimen. Additionally, the method includes rapidly scanning the focused beam over the area of the specimen to produce an image of the area; and accelerating SE and BSE, generated by the focused primary electron beam colliding with the specimen, to be captured by the annular detection and to form an image of scanned area.

An advantage of such a system is that a low energy (from 250eV to 1500 eV) electron microscope having such a lens system can scan a larger field (from 500 µm to 1000 µm) while maintaining a small spot size (from 0.05 µm to 0.1 µm in diameter) and a collection efficiency with an approximate range of about 85% to 95% for secondary electrons SE and back scattered electrons BSE for increased resolving power of features of the specimen.

Another advantage of a such a system is that a high current primary beam is provided along with a lower energy primary beam at the site of the specimen. This improves the quality of the signal that is emitted from the specimen during its scan.

These and other features, aspects and advantages of the present invention will become better understood with regard to the following description, appended claims, and accompanying drawings where:

DETAILED DESCRIPTION

Figure 1:
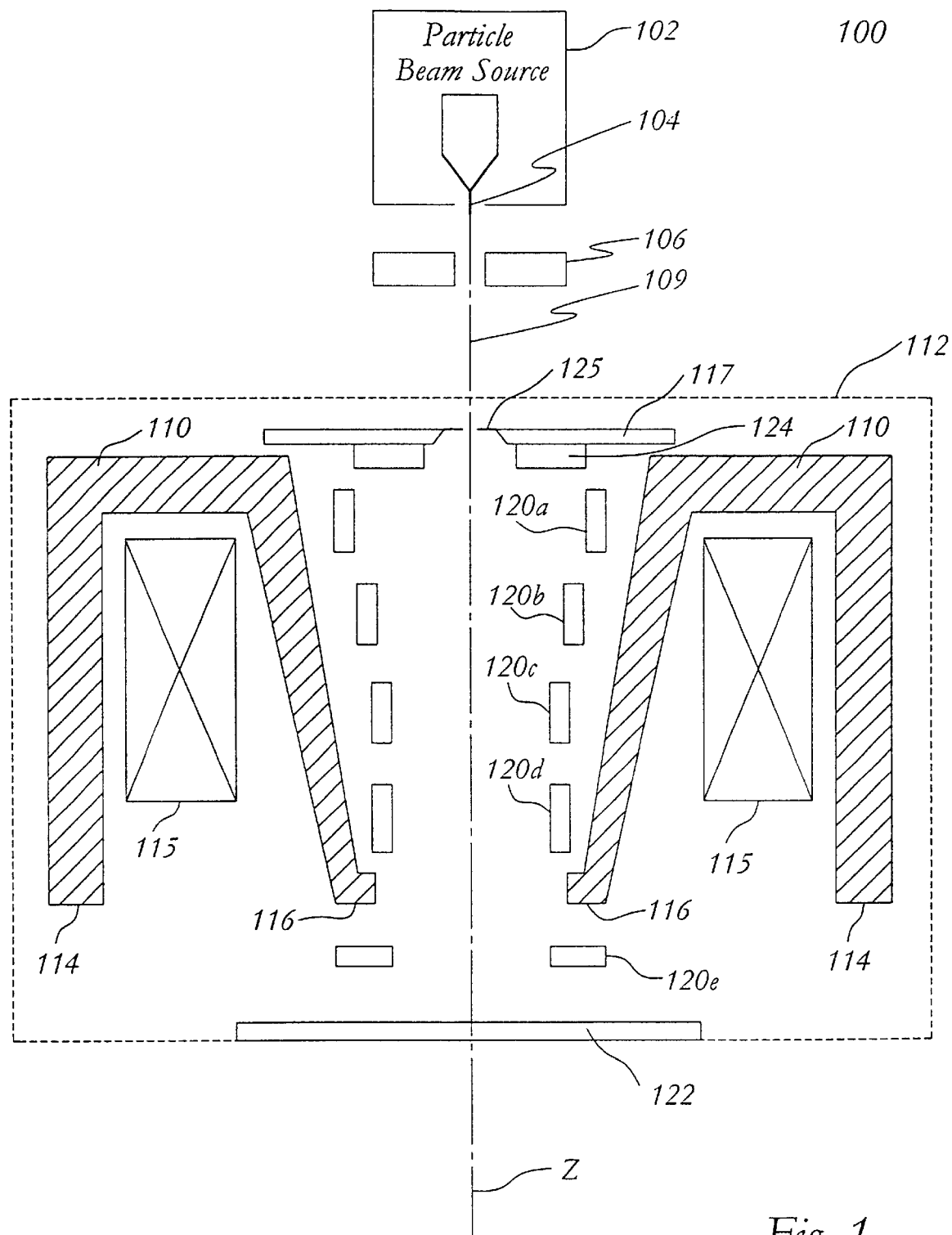
FIG. 1 is a diagram illustrating a cross-section of an embodiment of a scanning electron microscope in accordance with the present invention.

FIG. 1 illustrates an embodiment of a scanning electron microscope 100 in accordance with the present invention. In this embodiment, the scanning electron microscope 100 comprises a particle beam source 102 with virtual source point 104 (i.e., the effective source point for the particles), an anode 106, an objective lens system 112 having a magnetic lens therein and a plurality of deflection units 120a–120e. For reference purposes, a beam axis 109 is defined as the line connecting the particle beam source 102 to the specimen 122 and is designated the Z-axis, the X and Y axes defining a plane transverse to the Z-axis.

The magnetic lens includes material 110 and exciting coils 115 for providing magnetomotive force to a magnetic circuit having field lines through the magnetic material and between the pole faces 116 and 114. The central bore of the magnetic lens has the shape of a circular bucket which is axially symmetric about the Z-axis. At the place where the primary particle beam enters the lens system, material 117 forms a beam-defining aperture 125. This aperture determines the size of the beam allowed to enter the objective lens system and in one embodiment confines the beam diameter to a range of about 20 µm to 200 µm. A lens aperture at the point where the primary particle beam exits the magnetic lens is circumscribed by pole face 116.

Immediately below the beam defining aperture is an annular detector unit 124 which collects secondary SE and back scattered electrons BSE emitted from the specimen during the scanning operation discussed below. Detector unit 124 has an aperture that is large than the beam defining aperture so the particles from the primary beam are not affected by the detector as they pass through the beam defining aperture.

Residing in the central bore are deflection units 120a–120d. These units are disk-shaped rings which are axially symmetric about the Z-axis. Located outside of the central bore is deflection unit 120e which is coaxial with the Z-axis and similar in construction to the deflection units within the central bore.

Objective lens 112 focuses the particle beam into a small spot which is scanned over the specimen 122 to be studied. Typically, the specimen is a semiconductor wafer having feature sizes of about 0.05 µm to 0.20 µm or larger.

Figure 2:
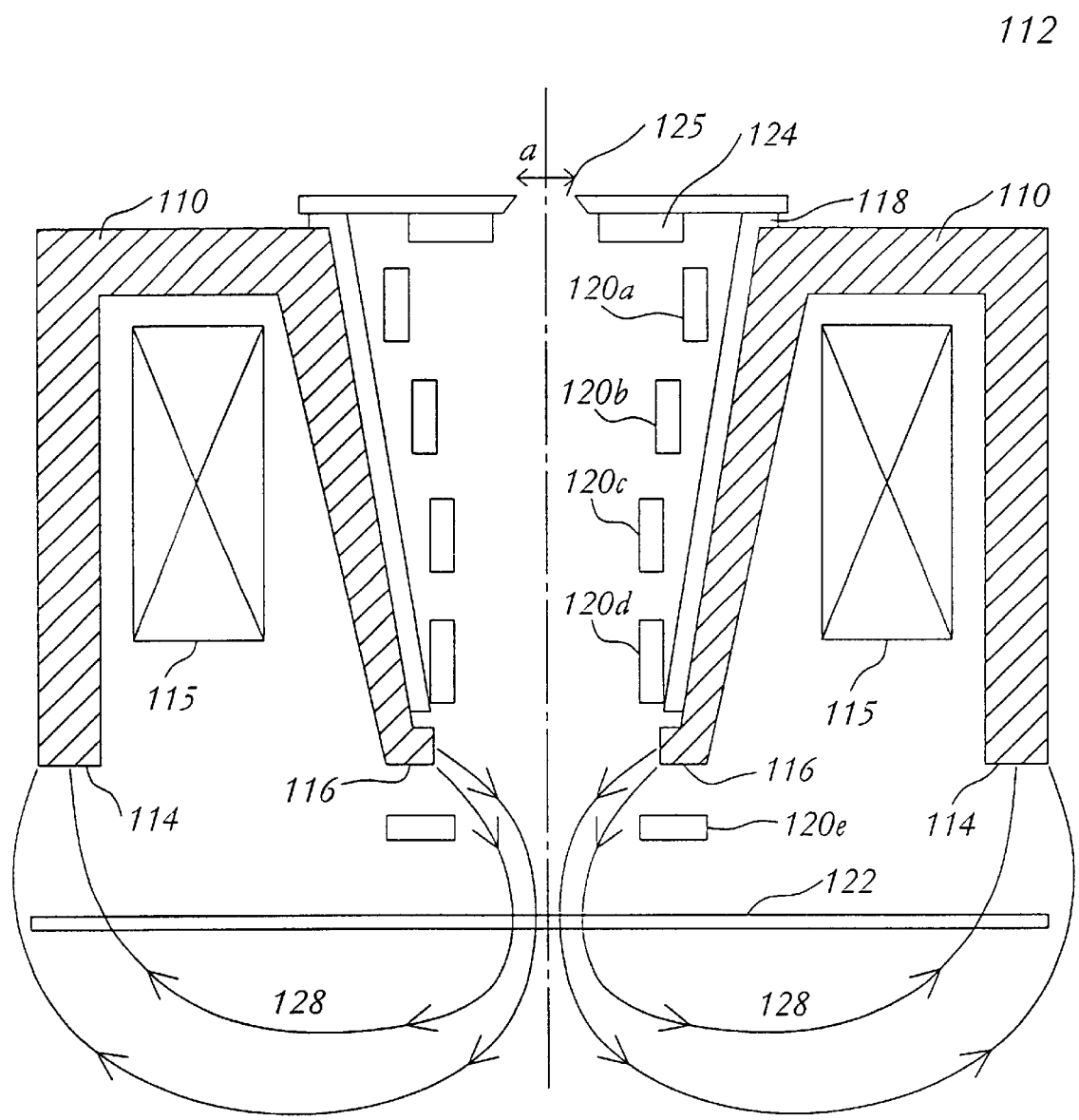
FIG. 2 is a diagram illustrating a cross-section of an embodiment of an objective lens system for a scanning electron microscope in accordance with the invention.

FIG. 2 shows a cross-section view of the objective lens 112. Magnetic material 110 and exciting coils 115 form a type of magnetic lens called a side-pole lens. The side-pole magnetic lens is preferred because it has improved capability in reducing the chromatic and spherical aberration typically associated with other types of objective lenses and is better at extending its field below the lens aperture and through the specimen 122. In the side-pole magnetic lens, material 110 is shaped to form ring-shaped pole face 114 and circular pole face 116 between which the magnetic field lines 128 connect pole face 114 and 116 to complete the magnetic circuit. This produces a magnetic field 128, which field is designed to extend through deflection unit 120e and specimen 122 in its path to pole face 114 as shown in FIG. 2. Accordingly, specimen 122 is said to be immersed in the magnetic field of the lens. Material 110 is preferably iron, iron alloy or other high permeability material for providing a low reluctance path for the magnetic field generated by the exciting coils 115. The goal of magnetic lens 110 is to generate a magnetic field with a large component perpendicular to the Z-axis for converging lens action above the specimen and to have the magnetic field substantially parallel to the Z-axis at the specimen.

As discussed above in reference to FIG. 2, material 110 is shaped to form a bucket-shaped central bore which is axially symmetric about the Z-axis and which provides a place for locating the deflection units 120a–120d within the magnetic lens. Each deflection unit has a different diameter and fits at a particular position along the Z-axis within the bucket-shaped space. For the deflection units within the magnetic lens, deflection unit 120a is the largest in diameter and deflection unit 120d is the smallest in diameter. Deflection unit 120e is located below the circular pole piece 116 and within the influence of the magnetic field from the magnetic lens. Deflection units 120a–120e work together as discussed below to deflect the particle beam so that the specimen 122 can be scanned. In some embodiments an actual bucket-shaped structure 118 holds the deflection units 120a–120d and the structure is inserted into the bucket-shaped space of the lens system thus making assembly easier.

Below deflection unit 120e is the specimen 122, which is carefully positioned underneath the deflection unit 120e and to be within the focusing distance of the lens. The magnetic lens is focused to produce a small spot on the specimen by varying the current in the exciting coils 115. An increase in current creates a more intense field in the aperture, which causes the beam to converge to a spot at a position closer to pole piece 116. Decreasing the current causes the beam to converge to a spot at a distance farther from pole piece 116. Not only is specimen 122 immersed within the magnetic field of the magnetic lens but it is also charged to a potential, which causes the particle beam to reduce its energy before colliding with the specimen. The field produced from the charged specimen is called the retarding field and is discussed below.

Figure 3:
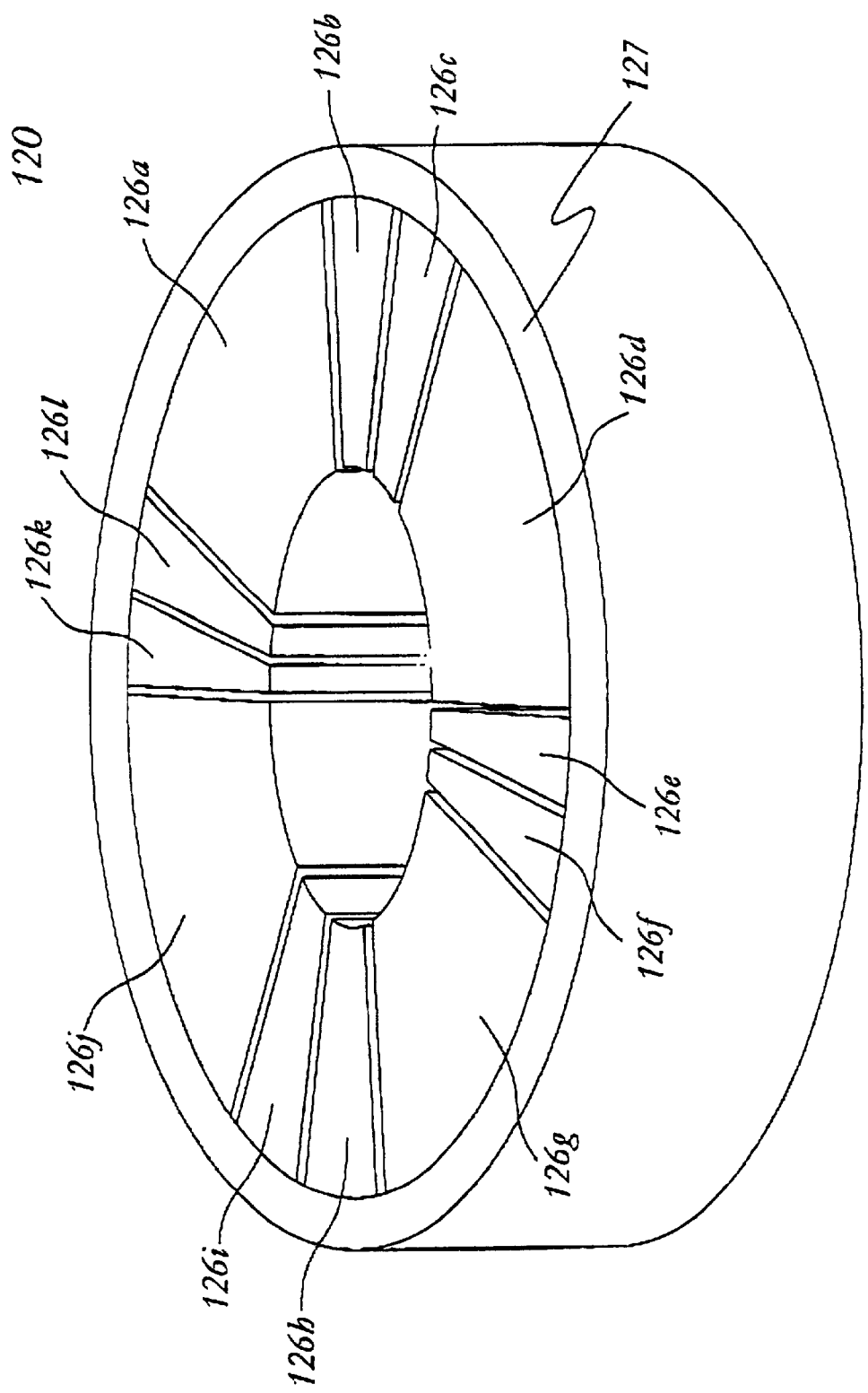
FIG. 3 gives a perspective view of a deflection unit of the objective lens system.

Deflection units 120a–120e are designed to deflect the particle beam so that the specimen can be scanned by the focused beam. Referring to FIG. 3, each deflection unit 120 is shaped like a flat circular cylinder having a circular opening and a plurality of conducting segments 126a–126l around the opening. Separating each of the segments is an insulating radial barrier 127 formed from the substrate material of the disk. In one embodiment, conducting segments are made from conducting metal, such as copper or beryllium copper, and the substrate is a ceramic material such as approximately 95% to 98% alumina. In the preferred embodiment, the deflection unit ring includes twelve separate conducting segments. The various segments are grouped together and the group is tied to a variable voltage driver. In this embodiment, there are 4 groups each comprising 3 segments. Two of the groups control deflection in the X direction and two of the groups control deflection in the Y direction. By controlling the voltage of these segments the particle beam is deflected away from some segments and towards other segments in a precise manner permitting accurate deflection of the beam. The four groups of 3 segments is preferred over alternative arrangements such as four groups of 2 segments (eight segments) and four groups of five segments (20 segments). The first alternative of four groups of two segments has the disadvantage that eight drivers are required making the unit difficult to control for high speed operation. The second alternative of four groups of five segments has the disadvantage that there are two many individual segments, which makes construction of the unit difficult because of the resulting small size of each segment.

Figure 4:
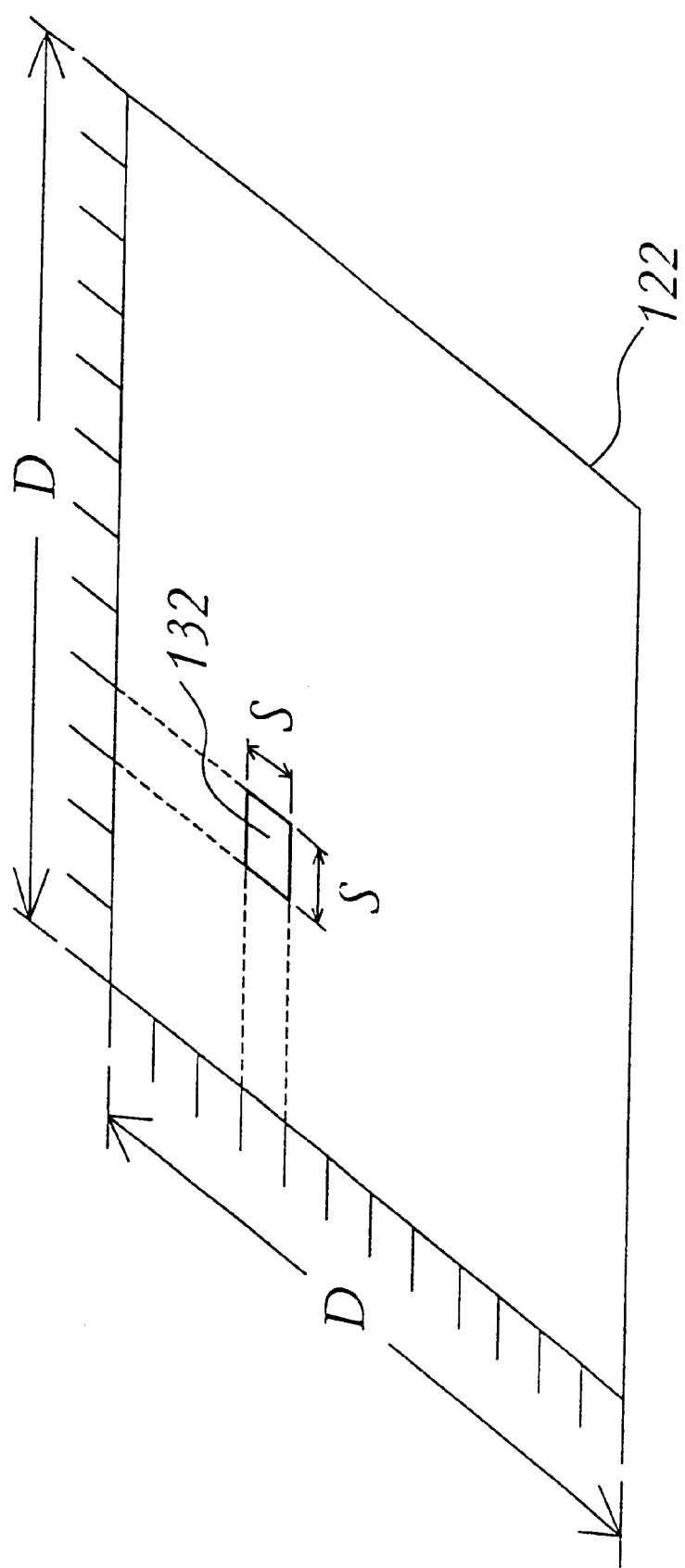
FIG. 4 shows a representative deflection field and scan field area on a specimen.

In accordance with the present invention, a first set or "swinging group" of deflection units 120a, 120d and 120e is dedicated to the accurately but relatively slowly positioning of the focused beam over a precise point on the specimen within the deflection field of the lens. Referring to FIG. 4, the swinging group of deflection units can deflect the beam spot a deflection field distance D of about 600 $\mu$m in one version of the invention. A second set of deflection units 120b and 120c is dedicated to producing a more rapid scanning movement of the beam to cover an area 132, S by S, where S is approximately 50 $\mu$m, and the area is centered on the position determined by the first set of deflection units. Scanning is performed by dwelling on a point for a period of time (on the order of tens of nanoseconds), moving to the next point in a row of points and then repeating the scan operation for the next row until an entire grid of points covering the area is scanned. In one version of the invention, a point or pixel size for this scanning is about 0.1 $\mu$m (100 $\mu$m) which means that there are about 500 pixels in each 50 $\mu$m scan line and about 6000 pixels in the X or Y direction of the overall deflection field D. If the beam spot rests at a position on the specimen for 10 ns then a single scan of a 50 $\mu$m line requires about 5 $\mu$s and the scan of the entire S by S area takes at least 2.5 ms. In practice, an additional amount of time (about 1 $\mu$s/scan line) is required for retracing the beam between each successive scan causing the total time to scan the S by S field to be about 3 ms (2.5 ms÷500×1 $\mu$s).

Deflection unit 120e is particularly important to improving the size D in FIG. 4 of the deflection field over the specimen because it is closest to the specimen and in the retarding field produced by the specimen. Thus deflection unit 102e will have a large effect on the position of the particle beam because it is deflecting a beam with much lower energy than the deflection units 102a–102d and it is the deflection unit nearest the landing point of the beam on the specimen.

Figure 5:
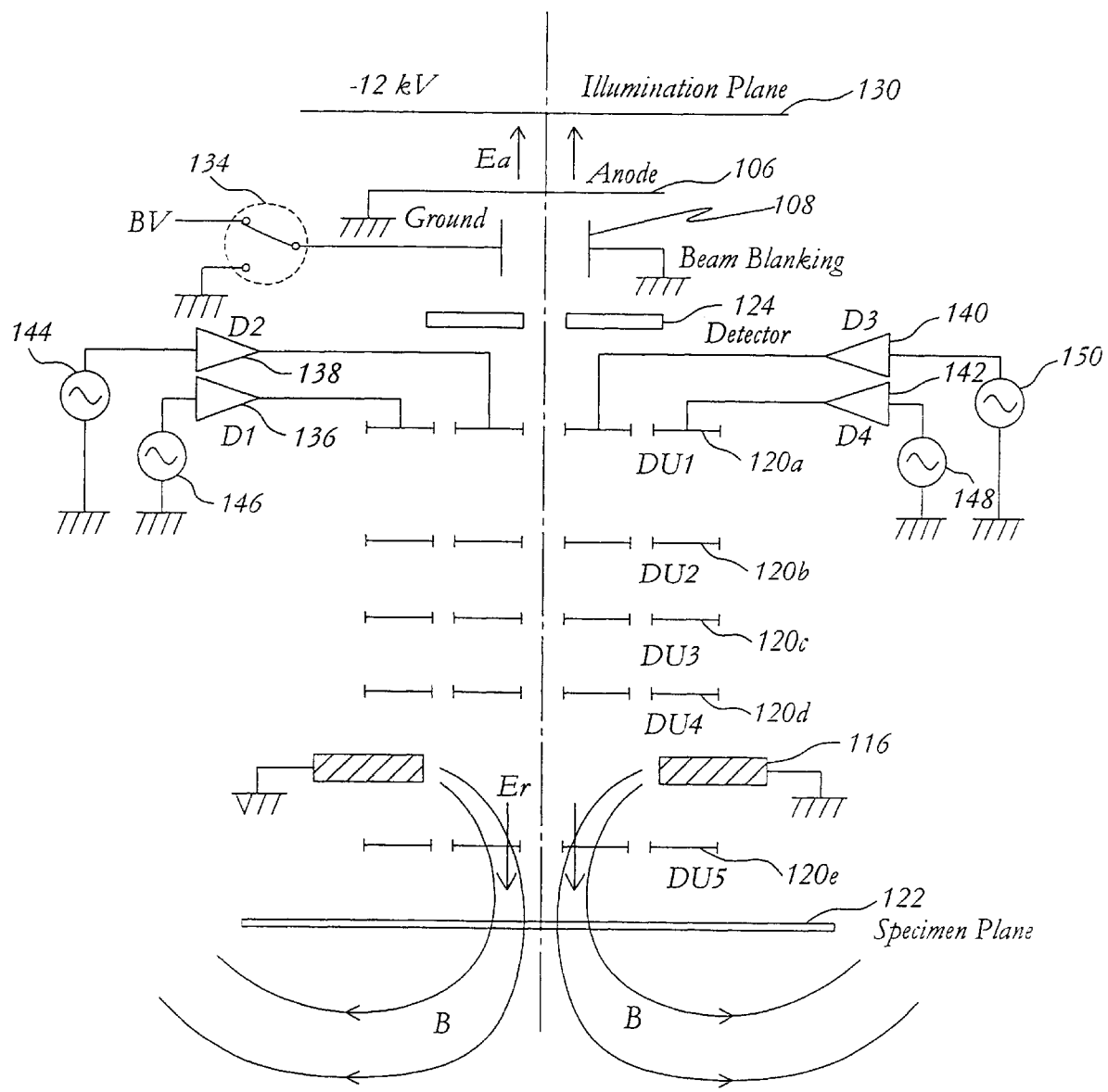
FIG. 5 shows a schematic diagram illustrating the various control voltages used in the operation of the lens system.

FIG. 5 gives a schematic of an electron microscope having an objective lens system in accordance with the present invention. At opposing ends of the microscope are the illumination plane 130, which represents the virtual source point of electrons from the particle source and the specimen plane 122. Between these two ends and in order starting at the illumination plane are the accelerating anode 106, beam blanking plates 108, a detector 124, deflection units 120a, 102b, 120c, 120d, magnetic field poles 116 and deflection unit 120e.

The illumination plane is, in one embodiment, preferably charged to a potential of approximately −12KV. Proximate to the illumination plane is the anode electrode plane 106, which is charged to the ground potential. The voltage difference between the illumination plane and the anode plane provides the accelerating potential for the electrons emitted from the source. Once accelerated the electrons gain an energy of approximately 12K electron volts (12 KeV) resulting in an electron wavelength of about 0.01 nanometers (1 nm=$10^{-9}$ meters). Field Ea in FIG. 5 depicts the accelerating electric field.

Specimen 122 at the specimen plane position is charged to approximately −11 KV to create a retarding field Er, that is, a field in the opposite direction to the accelerating field Ea to reduce the energy of the primary beam prior to impact with the specimen.

Between the accelerating anode 106 and a detector 124 are the beam blanking plates 108, which are used to switch the primary beam on and off. Proximate to the blanking plates 108 is the annular detector for collecting the secondary and back-scattered electrons that are produced when the primary beam collides with the specimen. The annular detector derives an electronic signal from these collected electrons, amplifies the signal and sends the amplified signal to an imaging device for ultimate viewing by the operator.

Between the detector and the specimen plane are the deflection units 120a–120e. In one version of the invention, the average potential of each of the four deflection units 120a–120d is ground which helps to maintain the initial beam energy as the primary beam travels through the deflection units. To deflect the beam the ring segments are grouped as discussed above and each group is driven by a driver. In the preferred embodiment there are four drivers 136, 138, 140, 142, one for each of the four groups. Two drivers control the X direction of deflection and two drivers control the Y direction of deflection. In one version of the invention, the drivers drive the X groups differentially and the Y groups differentially. By altering the potential of these groups above and below the average ground potential, the beam is deflected a precise amount in a particular direction while maintaining the average potential of the unit at ground. The field pattern in the deflection unit is complex and is calculated to minimize the introduction of aberrations into the beam when deflecting the primary beam.

The deflection unit 120e, closest to the specimen plane and in the retarding field Er, is charged to a potential that does not substantially alter this field Er. In one version of the invention, the deflection unit 120e is charge to an average potential that is negative relative to the specimen plane and in the range of about –200 V to –3000 V relative to the specimen plane.

When electrons reach the specimen plane their energy is in the range of about 250 eV to 1500 eV, with 1 KeV being a typical value. Energies in this range avoid damage to the specimen but cause an increase in wavelength in the range of about 0.03 to 0.07 nm at the specimen.

Placing the deflection unit 120e in the retarding field gives the deflection unit 120e a great deal of influence over the trajectory of the primary beam because the primary beam energy has been reduced to approximately 1 KeV. Furthermore because of its proximity to the specimen it can help to accurately position the beam over a selected area of the specimen prior to the rapid scan of the area. Final spot size, taking into account the widening of the beam due to the retarding field and all of the other aberrations (chromatic astigmatism and coma) is approximately 10 nm, which is sufficient for viewing feature sizes in a range of about 20 nm to 200 nm.

FIG. 5 also illustrates that magnetic field lines from the magnetic lens are present in the retarding field Er arising from the specimen plane. The reduced energy of the primary beam needs to be taken into account when determining the strength of the magnetic field needed to focus the beam on the specimen.

Figure 6A:
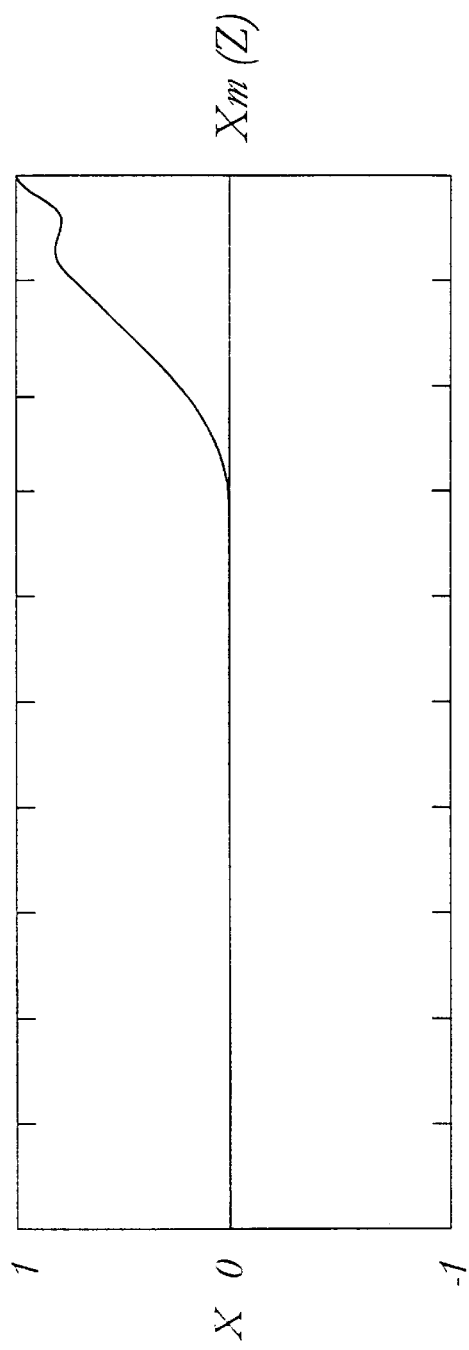
FIG. 6A illustrates the x-dimension for deflection of the beam spot within the scan field.
Figure 6B:
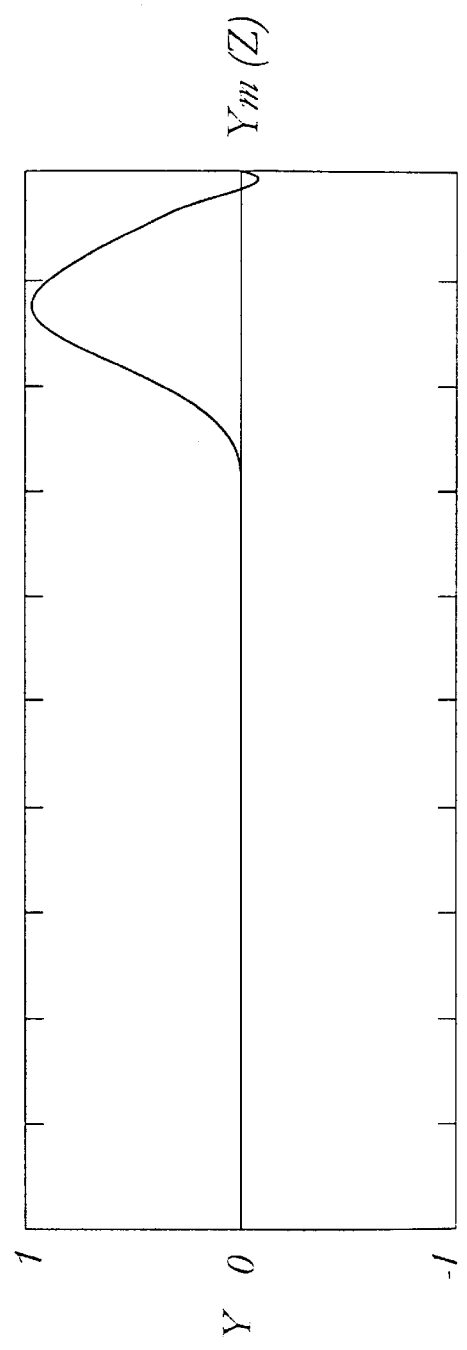
FIG. 6B illustrates the y-dimension for deflection of the beam spot within the scan field.

FIG. 6A illustrates the x-dimension for deflection of the beam within the deflection field by the deflection units 120a, 120d and 120e; and FIG. 6B illustrates the y-dimension for deflection of the beam within the deflection field by these same deflection units. Thus these figures illustrate the trajectory components Xm(z), Ym(z) of the primary electron beam when deflected by the deflection units 120a, 120d and 120e.

As a starting point to achieving a large deflection field, it is preferred that the voltage strength Ed and deflection distance r(z) for each deflection unit meet the first order Swinging Objective Retarding Immersion Lens (SORIL) criteria:

$$Ed = k[\tfrac{1}{2}B'(z)r(z)/z]\tfrac{1}{2}\phi''(z)r(z) + \phi'(z)r(z)/z$$

wherein Ed is the electric field strength within the deflection unit and orthogonal to the optical axis (Z-axis) to produce a given deflection, r(z) is the radial deflection distance from the Z-axis as a function of distance along the axis, B(z) is the magnetic flux density along the optical axis of the lens, $\phi(z)$ is the electrical potential on the optical axis, $\phi'(z)$ is the first order differentiation with respect to z, $\phi''(z)$ is the second order differentiation with respect to z, B'(z) is the first order differentiation with respect to z, and k is a constant to perform the required units conversion.

Because the deflection field strength from criteria specified in equation 1 only includes first order terms, it serves as a starting point for determining the field strength needed for a given deflection. However, even if equation 1 is satisfied, there may still be third order and fifth order aberrations to the primary beam caused by the deflection unit. To minimize or eliminate these higher order aberrations, an optimization is required. Generally, this optimization is carried out by numerical methods on digital computer and seeks to maintain the circular shape of the beam at maximum deflection from the Z-axis. Deflection units 120a, 120d, 120e each meeting Eq. 1 as a first approximation, act together to produce a given amount of deflection for positioning the particle beam within the deflection field D×D over an area S×S to be scanned (FIG. 4). The amount of deflection contributed from each unit may be different for each unit and each unit is separately optimized. Deflection units 120b and 120c, each meeting Eq. 1 as a first approximation, act together to produce the deflection needed for scanning the particle beam over an area S×S (FIG. 4). Deflection units 102b and 120c are designed to permit rapid deflection of the beam over the S×S area while deflection units 120a, 102d and 120e maintain the position of the beam within the D×D field. The combination of positioning (or slower moving) deflection units and rapid scanning deflection units separate from the positioning units yields the large deflection field (D×D) while still retaining the capability of rapid scanning of a subarea of the deflection field.

Figure 7:
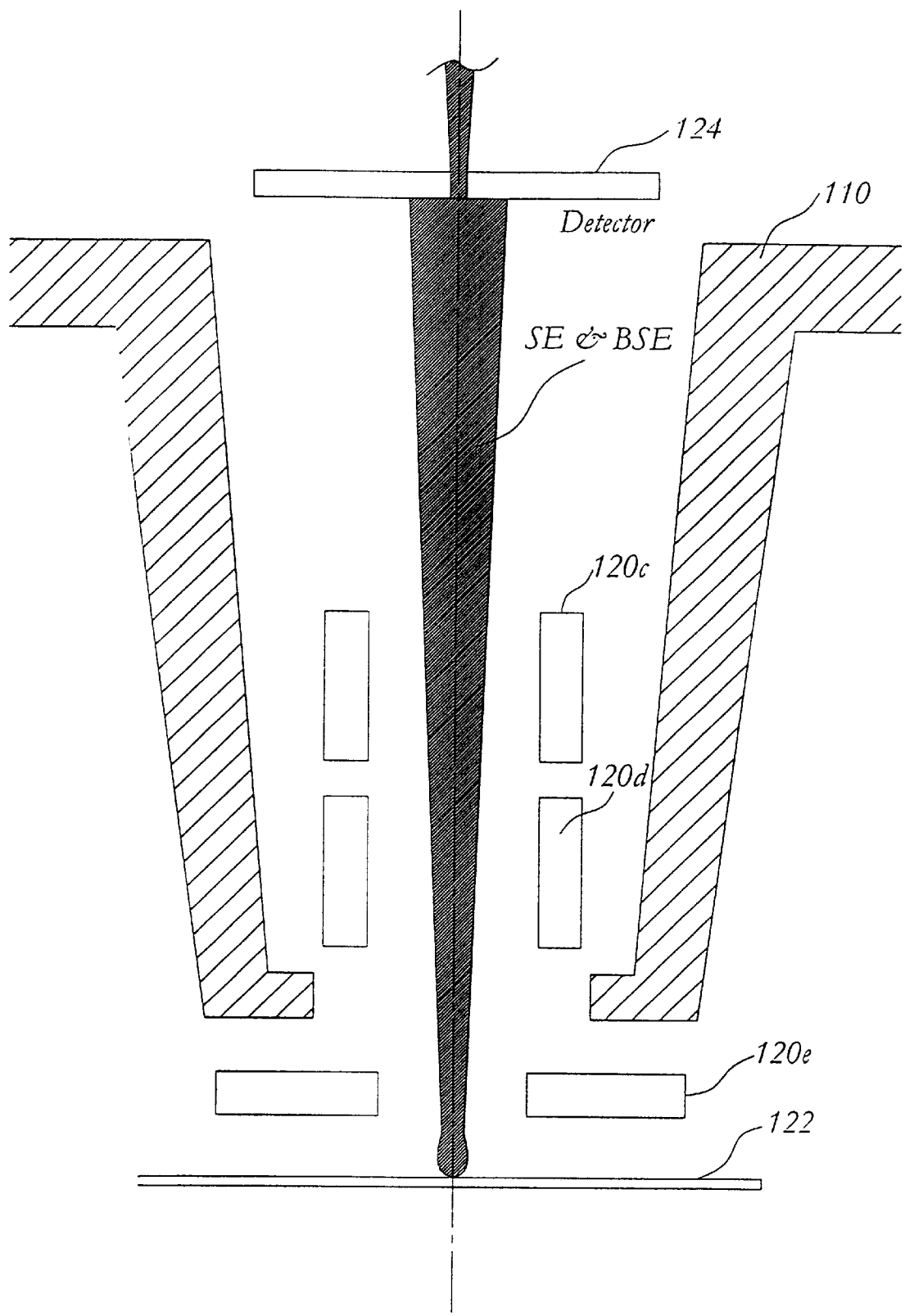
FIG. 7 illustrates the trajectories of secondary electrons SE and back scattered electrons BSE emitted from the center of the specimen, and collected by the detector.

FIG. 7 illustrates the trajectories of secondary electrons SE, generated by the primary electron colliding with the specimen. Because of the retarding electrical field Er, the secondary electrons will be accelerated to the energy of about 11 KeV. Most of these electrons are collected by the annular detector, which uses a PIN diode or other electron capture device. The size of the aperture of the annual detector is crucial. An aperture that is too small is easily contaminated and adversely affects the primary beam. An aperture that is too large decreases the collection efficiency of the secondary and back scatted electrons. In one embodiment, the detector aperture is limited to between 0.3 mm to 2.0 mm in diameter. In one embodiment, the secondary electron SE capture efficiency over the entire scan area is in the range of about 85% to 95%.

Although the present invention has been described in terms of specific embodiments, it is anticipated that alterations and modifications thereof will no doubt become apparent to those skilled in the art. It is therefore intended that the following claims be interpreted as covering all such alterations and modifications as falls within the true spirit and scope of the invention.

What is claimed is:

1. An swinging objective retarding immersion lens system for focusing a primary particle beam and moving the focused particle beam on a specimen to be examined and collecting the secondary electrons and back-scattered electrons generated by the primary beam colliding with the specimen, the system comprising:

a magnetic lens for generating a magnetic field in the vicinity of the specimen to focus the particles of the particle beam on the specimen, the magnetic lens having a central bore through which the particle beam travels;

an electrode having a potential for providing a retarding field to the particle beam near and at the specimen to reduce the energy of the particle beam when the beam collides with the specimen; and a deflection system including a plurality of deflection units situated along the beam axis for deflecting the particle beam to allow scanning of the specimen, at least one of the deflection units located in the retarding field of the beam, the remainder of the deflection units located within the central bore of the magnetic lens.

2. An objective lens system as recited in claim 1, wherein the primary particle beam is an electron beam; and further comprising a detection unit for collecting back-scattered electrons and secondary electrons generated by the primary beam colliding with the specimen, the detection unit positioned to capture the back-scattered electron and secondary electrons travelling along the beam axis in a direction opposite to the primary beam.

3. An objective lens system as recited in claim 1, wherein the primary particle beam is an electron beam.

4. An objective lens system as recited in claim 1, wherein the magnetic lens is a side-pole magnetic lens.

5. An objective lens system as recited in claim 1, wherein the central bole of said magnetic lens is axially symmetric about the beam axis.

6. An objective lens system as recited in claim 1, wherein a first group of the plurality of deflection units deflects the particle beam to position the beam at a starting position over an area to be scanned, and wherein a second group of the plurality of deflection units moves the particle beam in a scanning motion over the area so that an image of the area can be constructed.

7. An objective lens system as recited in claim 6, wherein the first group of deflection units deflects the particle beam to a starting position with a speed that is slow relative to the scanning speed of the beam.

8. An objective lens system as recited in claim 6, wherein the deflection unit positioned in the retarding field is included in the first group of deflection units.

9. An objective lens system as recited in claim 1, wherein the plurality of deflection units located within the central bore of the magnetic lens is maintained at an average potential higher than the source of the particle beam source to maintain the energy of the particle beam while the beam travels through the central bore.

10. An objective lens system as recited in claim 9, wherein the particle beam source is maintained at negative potential and wherein the plurality of deflection units located within the central bore of the magnetic lens is maintained at average ground potential.

11. An objective lens system as recited in claim 10, wherein the negative potential of the particle beam source is about −12 kV.

12. An objective lens system as recited in claim 10, wherein the negative potential of the particle beam source is varied within a range of about −2 kV to −35 kV.

13. An objective lens system as recited in claim 1, wherein the specimen has a positive potential relative to a source potential of the particle beam;

wherein the deflection unit located in the retarding field is maintained at an average potential that is negative relative to the potential of the specimen.

14. An objective lens system as recited in claim 13, wherein the positive potential of the specimen is in the range of about 250 V to 1500 V.

15. An objective lens system as recited in claim 13, wherein the negative average potential of the deflection unit is in the range of about −200 V to −3000 V.

16. An objective lens system as recited in claim 1, wherein a deflection unit has an aperture through which the primary beam passes; and wherein the deflection unit has a voltage strength (Ed) across the aperture and a deflection distance (r(z)) that meets a first order swinging objective retarding immersion lens criteria:

$$Ed=k[\tfrac{1}{2}B'(z)r(z)+B(z)r(z)/z]+\tfrac{1}{2}\phi''(z)r(z)+\phi'(z)r(z)/z$$

wherein Ed is the electric field strength within the deflection unit and orthogonal to the optical axis (Z-axis) to produce a given deflection, r(z) is the radial deflection distance from the Z-axis as a function of distance along the axis, B(z) is the magnetic flux density along the optical axis of the lens, $\phi(z)$ is the electrical potential on the optical axis, $\phi'(z)$ is the first order differentiation with respect to z, $\phi''(z)$ is the second order differentiation with respect to z, B'(z) is the first order differentiation with respect to z, and k is a constant to perform the required units conversion.

17. An objective lens system as recited in claim 16, wherein the deflection unit has a voltage strength and deflection distance which are optimized to substantially reduce third order and fifth order aberrations.

18. An objective lens system as recited in claim 1, wherein the central bore of the magnetic lens has a bucket-shape and wherein the deflection units located within the central magnetic lens near the top of the bucket have a larger diameter and near the bottom of the bucket a smaller diameter.

19. An objective lens system as recited in claim 1, wherein the central bore of the magnetic lens has a beam-defining aperture at a point where the primary particle beam enters the central bore and a lens aperture at a point where the primary particle beam exits the central bore of the magnetic lens.

20. An objective lens system as recited in claim 1, wherein the central bore of the magnetic lens has a beam-defining aperture at a point where the primary particle beam enters the central bore; and further comprising a annular detection unit located underneath a point where the primary particle beam enters the central bore, the detection unit having an aperture larger than the beam-defining aperture.

21. An objective lens system as recited in claim 20, wherein the detectors have an aperture in the range of about 0.3 mm to 2 mm in diameter.

22. An objective lens system as recited in claim 1, wherein the deflection units are electrostatic deflection units.

23. An objective lens system as recited in claim 1, wherein each of the deflection units includes:

a plurality of conducting segments, each segment being insulated from the others and substrate for supporting the conducting segments, the substrate having a hole surrounded by the conducting segments and through which the primary particle beam passes; and wherein a voltage is applied to at least two of the segments to deflect the particle beam traveling through the deflection units.

24. An objective lens system as recited in claim 23, wherein each of the deflection units includes twelve conducting segments arranged in four groups of three segments each; and wherein a separate voltage is applied to each of the four groups of segments to deflect the primary particle beam.

25. An objective lens system as recited in claim 1, wherein two of the four groups deflect the primary particle beam in the X direction and wherein the other two of the four groups deflect the primary beam in the Y direction.

26. An objective lens system as recited in claim 1, wherein the X-direction and Y-direction groups are driven differentially.

27. A method for increasing a scan field of an objective lens system over a specimen, the method comprising the steps of:

generating a magnetic field in the vicinity of the specimen to focus the particles of the particle beam on the specimen;

providing a retarding electric field to reduce the energy of the particle beam prior to the beam colliding with the specimen;

positioning the focused particle beam over an area to be scanned, the area being within the deflection field of the specimen, a final stage of positioning occurring by deflecting the beam within the retarding electric field to increase the deflection field over the specimen.

28. The method of claim 27, wherein a deflection unit has an aperture through which the primary beam passes; and wherein the deflection unit has a voltage strength (Ed) across the aperture and a deflection distance (r(z)) that meets a first order swinging objective retarding immersion lens criteria:

$$Ed=k[½B'(z)r(z)+B(z)r(z)/z]+½\phi''(z)r(z)+\phi'(z)r(z)/z$$

wherein Ed is the electric field strength within the deflection unit and orthogonal to the optical axis (Z-axis) to produce a given deflection, r(z) is the radial deflection distance from the Z-axis as a function of distance along the axis, B(z) is the magnetic flux density along the optical axis of the lens, $\phi(z)$ is the electrical potential on the optical axis, $\phi'(z)$ is the first order differentiation with respect to z, $\phi''(z)$ is the second order differentiation with respect to z, B'(z) is the first order differentiation with respect to z, and k is a constant to perform the required units conversion.

29. An objective lens system as recited in claim 28, wherein the deflection unit has a voltage strength and deflection distance that are optimized to substantially reduce third order and fifth order aberrations.

30. The method of claim 27, wherein the particle beam is an electron beam.

31. The method of claim 27, wherein the step of generating an magnetic field comprises the step of generating the magnetic field from a magnetic lens.

32. The method of claim 31, wherein the magnetic lens is of a side-pole magnetic lens type.

33. The method of claim 32, wherein the side-pole magnetic lens includes a central bore formed therein, the central bore being axially symmetric about said beam axis.

34. A scanning microscope for viewing a specimen, comprising:

a primary particle beam source;

an accelerating electrode (anode) for imparting energy to the primary particle beam;

an objective lens system for focusing the primary particle beam source on the specimen, the objective lens system comprising:

a magnetic lens for generating a magnetic field in the vicinity of the specimen to focus the particles of the particle beam on the specimen, the magnetic lens having a central bore through which the particle beam travels;

an electrode having a potential for providing a retarding field to the particle beam near the specimen to reduce the energy of the particle beam when the beam collides with the specimen; and a deflection system including a plurality of deflection units situated along the beam axis for deflecting the particle beam to allow scanning of the specimen, at least one of the deflection units located in the retarding field of the beam, the remainder of the deflection units located within the central bore of the magnetic lens.

35. An electron microscope as recited in claim 34, further comprising a condenser lens system configured to receive the primary particle beam from the particle beam source and to provide a focused primary particle beam to the objective lens system.

36. The microscope of claim 34, wherein the particle beam source is an electron beam source.

37. The microscope of claim 34, wherein the magnetic lens is a side-pole magnetic lens.

38. The microscope of claim 34, wherein the magnetic lens includes a central bore formed therein.

39. The microscope of claim 38, wherein the central bore of the magnetic lens is axially symmetric about the beam axis.

40. The microscope of claim 34, wherein a deflection unit has an aperture through which the primary beam passes;

wherein the deflection unit has a voltage strength (Ed) across the aperture and a deflection distance (r(z)) that meets a first order swinging objective retarding immersion lens criteria:

$$Ed=k[½B'(z)r(z)+B(z)r(z)/z]+½\phi''(z)r(z)+\phi'(z)r(z)/z$$

wherein Ed is the electric field strength within the deflection unit and orthogonal to the optical axis (Z-axis) to produce a given deflection, r(z) is the radial deflection distance from the Z-axis as a function of distance along the axis, B(z) is the magnetic flux density along the optical axis of the lens, $\phi(z)$ is the electrical potential on the optical axis, $\phi'(z)$ is the first order differentiation with respect to z, $\phi''(z)$ is the second order differentiation with respect to z, B'(z) is the first order differentiation with respect to z, and k is a constant to perform the required units conversion.

41. An objective lens system as recited in claim 40, wherein the deflection unit has a voltage strength and deflection distance that is optimized to substantially reduce third order and fifth order aberrations.

42. The microscope of claim 34, wherein the deflection units are electro-static deflection units.

43. The microscope of claim 34, wherein the beam source is charged to a first potential, the accelerating anode is charged to a second potential, the retarding field electrode is charged to a third potential, the deflection units in the bore are charged to a fourth potential, the deflection unit outside the bore is charged to a fifth potential and the specimen is charged to a sixth potential; and wherein the relationships between the first through sixth potentials are relative, any potential capable of being ground potential.

44. The method of claim 27, wherein step of positioning the focused particle beam over an area to be scanned is performed by a first set of deflection units, the first set including a deflection unit located in the retarding field.

45. The method of claim 27, further comprising the step of scanning the area while the beam is held in position over the area being scanned, the scanning movement of the beam being more rapid than the positioning movement of the beam.

46. The method of claim 44,
wherein step of positioning the focused particle beam over an area to be scanned is performed by a first set of deflection units, the first set including a deflection unit located in the retarding field; and wherein the step of scanning the area is performed by a second set of deflection units separate from the first set.

47. The method of claim 44, further comprising the step of collecting secondary and back scattered electrons emitted from the specimen during the scanning of the area.

* * * * *